US011932931B2

(12) United States Patent
Yiu et al.

(10) Patent No.: US 11,932,931 B2
(45) Date of Patent: Mar. 19, 2024

(54) HYDROPHILIC METAL THIN FILM AND SPUTTERING METHOD FOR DEPOSITING THE SAME

(71) Applicant: NATIONAL TAIWAN UNIVERSITY OF SCIENCE AND TECHNOLOGY, Taipei (TW)

(72) Inventors: Pak-Man Yiu, New Taipei (TW); Jhen-De You, Taoyuan (TW); Jinn Chu, Taipei (TW); Sung-Tsun Wang, Chiayi County (TW)

(73) Assignee: NATIONAL TAIWAN UNIVERSITY OF SCIENCE AND TECHNOLOGY, Taipei (TW)

( * ) Notice: Subject to any disclaimer, the term of this patent is extended or adjusted under 35 U.S.C. 154(b) by 27 days.

(21) Appl. No.: 17/706,130

(22) Filed: Mar. 28, 2022

(65) Prior Publication Data
US 2023/0304138 A1    Sep. 28, 2023

(51) Int. Cl.
 C23C 14/16 (2006.01)
 C22C 38/00 (2006.01)
 C22C 38/44 (2006.01)
 C22C 38/58 (2006.01)
 C23C 14/34 (2006.01)
 C23C 14/35 (2006.01)

(52) U.S. Cl.
 CPC .......... C23C 14/165 (2013.01); C22C 38/002 (2013.01); C22C 38/44 (2013.01); C22C 38/58 (2013.01); C23C 14/3407 (2013.01); C23C 14/35 (2013.01)

(58) Field of Classification Search
 CPC ........ C22C 38/44; C23C 14/35; C23C 14/165
 See application file for complete search history.

(56) References Cited

PUBLICATIONS

Inoue, S., Saeki, T., Koterazawa, K., Uchida, H. and Iwasa, M., 2000. Stainless steel films deposited by dc unbalanced magnetron sputtering using SUS304 steel target. Nippon Kinzoku Gakkaishi (1952), 64(12), pp. 1218-1223. (Year: 2000).*
Sandmeyer Steel Company, "Specification Sheet: Alloy 304/304L (UNS S30400, S30403) W. Nr. 1.4301, 1.4307 Most Widely Used Austenitic Stainless Steel, a Versatile Corrosion Resistant Alloy for General Purpose Applications" (Year: 2014).*

(Continued)

*Primary Examiner* — Jophy S. Koshy
(74) *Attorney, Agent, or Firm* — Chun-Ming Shih; HDLS IR SERVICES

(57) ABSTRACT

The present invention relates to a hydrophilic metal thin film, which is formed by stacking a plurality of columnar structures. A plurality of tetrahedral structures is on the surface of the hydrophilic metal film, which is formed on the top of the columnar structures. The width of the tetrahedral structures is 15 nm to 120 nm. The hydrophilic metal thin film comprises: 35 to 95 at % of iron, 5 to 20 at % of chromium. The above-mentioned hydrophilic metal thin film is formed by magnetron sputtering method under the working pressure of argon gas ranging from 6 mTorr to 13 mTorr, and the sputtering time exceeds 20 minutes.

4 Claims, 10 Drawing Sheets (a) 2 mTorr  (b) 4 mTorr  (c) 6 mTorr (d) 8 mTorr  (e) 12 mTorr

(56) References Cited

PUBLICATIONS

Sandmeyer Steel Company, "Specification Sheet: Alloy 316/316L (UNS S31600, S31603) W. Nr. 1.4401, 1.4404 An Austenitic Stainless Steel Containing Molybdenum Which is More Corrosion Resistant than the Conventional 304/304L Stainless Steel" (Year: 2014).*

Yiu, P., You, J.-D., Wang, S.-T., and Chu, J. P., "Tunable hydrophilicity in a surface nano-textured stainless steel thin film deposited by DC magnetron sputtering", Applied Surface Science, vol. 555, 2021. doi: 10.1016/j.apsusc.2021.149705. (Year: 2021).*

* cited by examiner

HYDROPHILIC METAL THIN FILM AND SPUTTERING METHOD FOR DEPOSITING THE SAME

BACKGROUND OF THE INVENTION

1. Field of the Invention

The present disclosure relates to the field of metal thin film and sputtering method for depositing the same. More particularly, the present disclosure relates to a metal thin film with superior hydrophilicity and sputtering method for depositing the same.

2. Description of the Prior Art

The hydrophilicity and hydrophobicity of an object surface can generally be defined by the contact angle between water and the object surface. On a hydrophobic surface, the water droplets form a spherical shape due to cohesion, and the contact angle is greater than 90 degrees. There is better adhesive force between water and the object surface on the hydrophilic surface, and the water spreads on the object surface so that the contact angle is less than 90 degrees.

On the super-hydrophobic surface (contact angle of about 120 degrees or more), the dirt could be taken away by the flow of water droplets to achieve the purpose of self-cleaning. With regard to the super-hydrophilic surface (contact angle of about 10 degrees or less), a water film is formed thereon to push out the dirt, so as to achieve the purpose of self-cleaning or easy cleaning. In addition, the super-hydrophilic surface also provides functions of anti-fogging, anti-freezing, antifouling, and friction reduction. The characteristics modification of the object surface is very important in industrial and daily applications.

At present, most of the super-hydrophilic surfaces are made of organic coatings or polymer materials, or special chemicals are required, which is difficult to implement. Besides, the strength, corrosion resistance or biochemical stability of the coating sometimes cannot meet the demand. The market needs more different super-hydrophilic surface modification methods and coatings to meet different industrial, life and even biomedical applications.

SUMMARY OF THE INVENTION

The present invention provides a hydrophilic metal thin film comprising: 35 to 95 at (atom) % of iron and 5 to 20 at% of chromium, the hydrophilic metal thin film being formed by stacking a plurality of columnar structures, and a plurality of tetrahedral structures on the top of the columnar structures being arranged on the surface of the hydrophilic metal thin film, wherein a width of the tetrahedral structures is between 15 nm to 120 nm.

More particularly, a thickness of the hydrophilic metal thin film is between 100 nm and 900 nm.

More particularly, the hydrophilic metal thin film further comprises 1 to 15 at % of molybdenum or 0.1 to 3 at % of manganese.

More particularly, the hydrophilic metal thin film further comprises 10 to 20 at % of carbon.

More particularly, the hydrophilic metal thin film further comprises 5 to 15 at % of nickel.

More particularly, the hydrophilic metal thin film has a body-centered cubic crystal structure.

More particularly, a contact angle of the hydrophilic metal thin film is less than 20 degree.

More particularly, a root-mean-square roughness of the hydrophilic metal thin film ranges from 6 nm to 8.1 nm.

More particularly, the hydrophilic metal thin film is obtained by the following sputtering method: providing a substrate; providing a ferro-chromium alloy target; and sputtering the hydrophilic metal film on the substrate using a magnetron sputtering method under a vacuum level of $1 \times 10^{-3}$ mTorr, wherein an argon working pressure ranges from 6 mTorr to 13 mTorr, and a sputtering time exceeds 20 minutes.

The present invention also provides a sputtering method for forming a hydrophilic metal thin film comprising: providing a substrate; providing a ferro-chromium alloy target; and sputtering the hydrophilic metal film on the substrate using a magnetron sputtering method under a vacuum level of $1 \times 10^{-3}$ mTorr, wherein an argon working pressure ranges from 6 mTorr to 13 mTorr, and a sputtering time exceeds 20 minutes.

More particularly, the ferro-chromium alloy target comprises 40 at % to 90 at % of iron and 5 to 20 at % of chromium.

More particularly, the ferro-chromium alloy target further comprises 1 at % to 15 at % of molybdenum or 0.1 at % to 3 at % of manganese.

More particularly, the ferro-chromium alloy target is 304 stainless steel, 316 stainless steel, 420 stainless steel or 430 stainless steel.

More particularly, the ferro-chromium alloy target essentially consist of iron, chromium, nickel, manganese, molybdenum, carbon, phosphorus and sulfur.

More particularly, the magnetron sputtering method is direct current (DC) magnetron sputtering or radio frequency magnetron sputtering, the DC power range is between 50 watts and 200 watts.

More particularly, the sputtering method is DC magnetron sputtering first, and then radio frequency magnetron sputtering.

More particularly, the total sputtering time is at least 40 minutes.

The hydrophilic metal thin film provided by the present invention and its sputtering method utilizes a simple iron-chromium alloy material as a target, and applies a simple magnetron sputtering method to form a higher strength and more corrosion-resistant super-hydrophilic metal thin film than the organic hydrophilic film in the market. The hydrophilicity of the hydrophilic film can be controlled by adjusting the sputtering parameters to meet all kinds of demand in the industry, and provides functions of self-cleaning, anti-fogging, anti-freezing, anti-fouling, and friction reduction.

BRIEF DESCRIPTION OF THE DRAWINGS

FIG. 9 (b) shows the advancing angle and receding angle of 2 mTorr film, 4 mTorr film, 6 mTorr film, 8 mTorr film, and 12 mTorr film according to Example 1 of the present invention. FIG. 9 (c) is a broken line graph of hysteresis angle of 2 mTorr film, 4 mTorr film, 6 mTorr film, 8 mTorr film, and 12 mTorr film according to Example 1 of the present invention.

DETAILED DESCRIPTION OF THE PREFERRED EMBODIMENT

Figure 1:
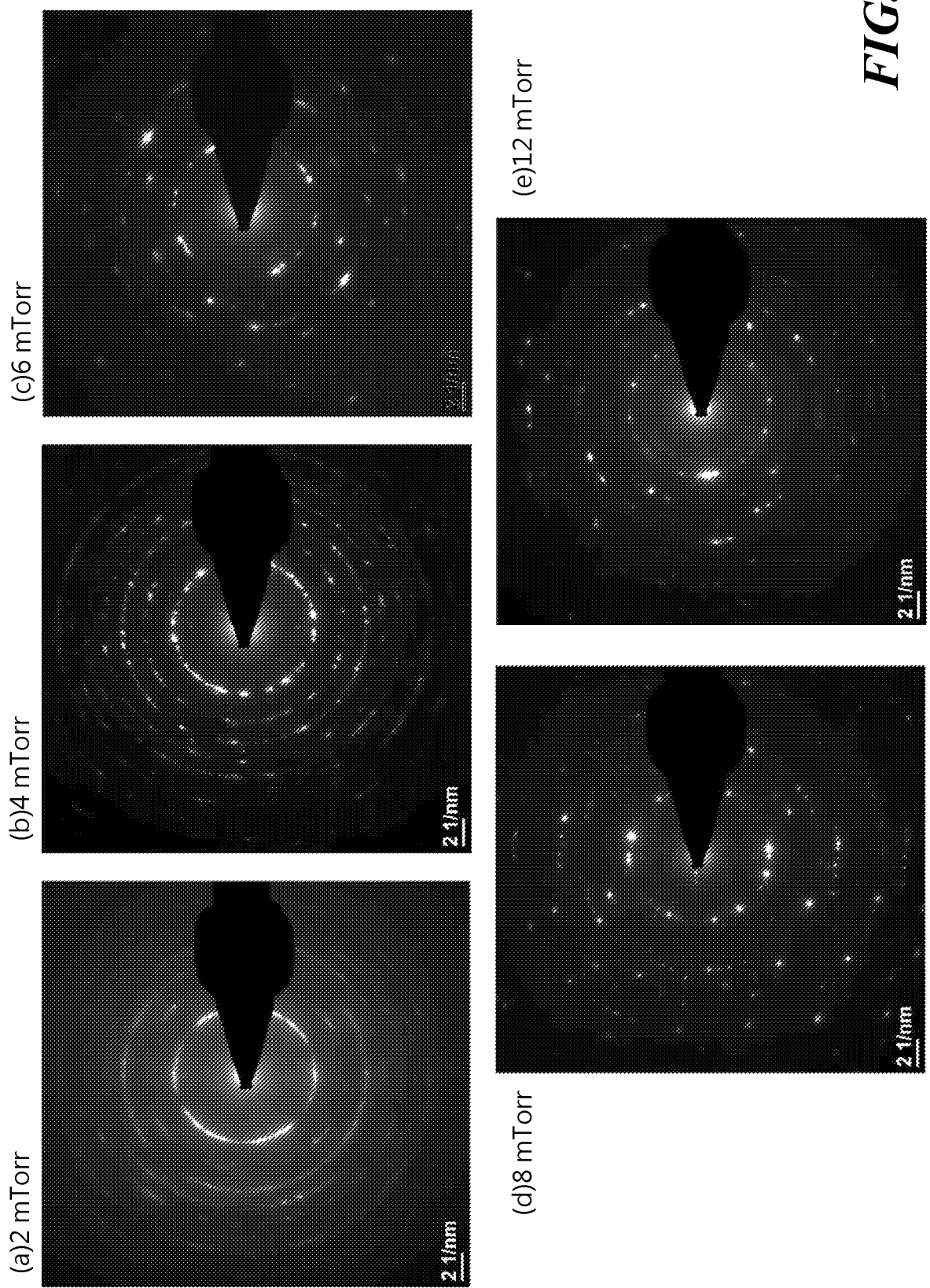
FIG. 1 (a) to (e) sequentially show the selected area electron diffraction (SAED) patterns of (a) 2 mTorr film, (b) 4 mTorr film, (c) 6 mTorr film, (d) 8 mTorr film, and (e) 12 mTorr film according to Example 1 of the present invention.

Other technical contents, aspects and effects in relation to the present invention can be clearly appreciated through the detailed descriptions concerning the preferred embodiments of the present invention in conjunction with the appended drawings.

In the first aspect, the present invention provides a hydrophilic metal thin film comprising: 35 to 95 at % of iron and 5 to 20 at % of chromium, the hydrophilic metal thin film being formed by stacking a plurality of columnar structures, and a plurality of tetrahedral structures on the top of the columnar structures being arranged on the surface of the hydrophilic metal thin film, wherein a width of the tetrahedral structures is between 15 nm to 120 nm. In some embodiments, the hydrophilic metal thin film further comprises 1 at % to 15 at % of molybdenum or 0.1 at % to 3 at % of manganese.

For example, the hydrophilic metal thin film comprises about 36 at %, about 38 at %, about 40 at %, about 42 at %, about 44 at %, about 46 at %, about 48 at %, about 50 at %, about 52 at %, about 54 at %, about 56 at %, about 58 at %, about 60 at %, about 62 at %, about 64 at %, about 66 at %, about 68 at %, about 70 at %, about 72 at %, about 74 at %, about 76 at %, about 78 at %, about 80 at %, about 82 at %, about 84 at %, about 86 at %, about 88 at %, about 90 at %, about 92 at %, or about 94 at % of iron. For example, the hydrophilic metal thin film comprises about 5 at%, about 7 at%, about 9 at%, about 11 at %, about 13 at %, about 15 at %, about 17 at %, or about 19 at % of chromium. For example, the hydrophilic metal thin film comprises about 1 at %, about 3 at %, about 5 at %, about 7 at %, about 9 at %, about 11 at %, about 13 at %, or about 15 at % of molybdenum. For example, the hydrophilic metal thin film comprises about 0.1 at %, about 0.3 at %, about 0.5 at %, about 0.7 at %, about 0.9 at %, about 1.1 at %, about 1.3 at %, about 1.5 at %, about 1.7 at %, about 1.9 at %, about 2.1 at %, about 2.3 at %, about 2.5 at %, or about 2.9 at % of manganese.

In the second aspect, the present invention provides a sputtering method for forming said hydrophilic metal thin film comprising: providing a substrate; providing a ferro-chromium alloy target; and sputtering the hydrophilic metal film on the substrate using a magnetron sputtering method under a vacuum level of $1 \times 10^{-1}$ mTorr, wherein an argon working pressure ranges from 6 mTorr to 13 mTorr, and a sputtering time exceeds 20 minutes.

In some embodiments, the width of the tetrahedral structures includes, but is not limited to, about 15 nm, about 20 nm, about 30 nm, about 40 nm, about 50 nm, about 60 nm, about 70 nm, about 80 nm, about 90 nm, about 100 nm, about 110 nm, and about 120 nm.

In some embodiments, the sputtering time ranges from 20 minutes to 100 minutes, it includes, but is not limited to, about 20 minutes, about 25 minutes, about 30 minutes, about 35 minutes, about 40 minutes, about 45 minutes, about 50 minutes, about 55 minutes, about 60 minutes, about 65 minutes, about 70 minutes, about 75 minutes, about 80 minutes, about 85 minutes, about 90 minutes, and about 100 minutes.

In some embodiments, the argon working pressure includes, but is not limited to, about 6 mTorr, about 6.5 mTorr, about 7 mTorr, about 7.5 mTorr, about 8 mTorr, about 8.5 mTorr, about 9 mTorr, about 9.5 mTorr, about 10 mTorr, about 10.5 mTorr, about 11.5 mTorr, about 12 mTorr, about 12.5 mTorr, and about 13 mTorr.

In some embodiments, the thickness of the hydrophilic metal thin film is between 100 nm and 900 nm. It includes, but is not limited to, about 100 nm, about 150 nm, about 200 nm, about 250 nm, about 300 nm, about 350 nm, about 400 nm, about 450 nm, about 500 nm, about 550 nm, about 600 nm, about 650 nm, about 700 nm, about 750 nm, about 800 nm, about 850 nm, and about 900 nm, In some embodiments, the contact angle of the hydrophilic metal thin film is less than 20 degree, it includes, but is not limited to, about 19 degree, about 17 degree, about 15 degree, about 13 degree, about 11 degree, about 9 degree, about 7 degree, about 5 degree, and about 3 degree.

In some embodiments, the root-mean-square roughness of the hydrophilic metal thin film includes, but is not limited to, 6, 6.1, 6.2, 6.3, 6.4, 6.5, 6.6, 6.7, 6.8, 6.9, 7, 7.1, 7.2, 7.3, 7.4, 7.5, 7.6, 7.7, 7.8, 7.9, 8.0, and 8.1 nm.

In some embodiments, the ferro-chromium alloy target comprises 40 at % to 90 at % of iron and 5 to 20 at % of chromium. For example, the ferro-chromium alloy target comprises about 40 at %, about 42 at %, about 44 at %, about 46 at %, about 48 at %, about 50 at %, about 52 at %, about 54 at %, about 56 at %, about 58 at %, about 60 at %, about 62 at %, about 64 at %, about 66 at %, about 68 at %, about 70 at %, about 72 at %, about 74 at %, about 76 at %, about 78 at %, about 80 at %, about 82 at %, about 84 at %, or about 86 at % of iron. For example, the ferro-chromium alloy target comprises about 5 at %, about 7 at %, about 9 at %, about 11 at %, about 13 at %, about 15 at %, about 17 at %, or about 19 at % of chromium.

In some embodiments, the ferro-chromium alloy target further comprises 1 at % to 15 at % of molybdenum or 0.1 at % to 3 at % of manganese. For example, the ferro-chromium alloy target further comprises about 1 at %, about 1 at %, about 3 at %, about 5 at %, about 7 at %, about 9 at %, about 11 at %, about 13 at %, or about 15 at % of molybdenum. For example, the ferro-chromium alloy target further comprises about 0.1 at %, about 0.3 at %, about 0.5 at %, about 0.7 at %, about 0.9 at %, about 1.1 at %, about 1.3 at %, about 1.5 at %, about 1.7 at %, about 1.9 at %, about 2.1 at %, about 2.3 at %, about 2.5 at %, about 2.7 at %, or about 2.9 at % of manganese.

In some embodiments, the ferro-chromium alloy target comprises 60 at % to 90 at % of iron, 10 to 20 at % of chromium and 0.1 at % to 3 at % of manganese. The ferro-chromium alloy target further comprises 5 at % to 15 at % of nickel. For example, the ferro-chromium alloy target further comprises about 5 at %, about 7 at %, about 9 at %, about 11 at %, about 13 at %, or about 15 at % of nickel.

In some embodiments, the ferro-chromium alloy target comprises 40 at % to 80 at % of iron, 5 to 20 at % of chromium and 1 at % to 15 at % of molybdenum. The ferro-chromium alloy target further comprises 10 at % to 20 at % of carbon. For example, the ferro-chromium alloy target further comprises about 10 at %, about 12 at %, about 14 at %, about 16 at %, about 18 at %, or about 20 at % of carbon.

In some embodiments, the ferro-chromium alloy target is 304 austenitic stainless steel (67 wt % to 73 wt % of iron, 18 wt % to 20 wt % of chromium, 8 wt % to 11 wt % of nickel, and 1 wt % to 2 wt % of manganese), 316 austenitic stainless steel (64 wt % to 72 wt % of iron, 16 wt % to 18 wt % of chromium, 10 wt % to 14 wt % of nickel, 1 wt % to 2 wt % of molybdenum, and 1 wt % to 2 wt % of manganese), 420 martensitic stainless steel (85 wt % to 87 wt % of iron, 12 wt % to 14 wt % of chromium, and 1 wt % to 2 wt % of manganese), 430 martensitic stainless steel (81 wt % to 85 wt % of iron, 14 wt % to 18 wt % of chromium, and 1 wt % to 2 wt % of manganese), or an chromium molybdenum iron alloy target. For example, 304 austenitic stainless steel (SUS304) may comprise about 69 at % of iron, about 20 at % of chromium, about 9.4 at % of nickel, about 1 at % of manganese. 316 austenitic stainless steel (SUS316) may comprise about 68 at % of iron, about 18.5 at % of chromium, about 11.5 at % of nickel, about 1 at % of molybdenum, about 1 at % of manganese. 420 martensitic stainless steel may comprise about 85 at % of iron, about 14 at % of chromium, and about 1 at % of manganese. 430 martensitic stainless steel may comprise about 82 at % of iron, about 17 at % of chromium, and about 1 at % of manganese.

In some embodiments, the hydrophilic metal thin film comprises: 65 at% to 69 at % of iron, 15 at % to 19 at % of chromium, 5 at % to 10 at % of nickel and 0.5 at % to 3 at % of carbon.

In some embodiments, when the magnetron sputtering method is DC magnetron sputtering or RF magnetron sputtering, the DC electric power ranges from 50 W to 200 W,
it includes, but is not limited to, about 50 W, about 75 W, about 100 W, about 120 W, about 150 W, about 175 W, and about 200 W.

Unless otherwise defined herein, all technical and scientific terms used have the same meaning as commonly understood by those skilled in the art to which the present invention belongs.

As used herein, the articles "a," "an," and "any" refer to the grammar of one or more than one (ie, at least one) item. For example, "an element" means one element or more than one element.

The term "about", "approximately" or "nearly" used herein substantially represents the stated value or range within 20%, preferably within 10%, and more preferably within 5%. The digitized quantities provided in the article are approximate value, meaning that if the terms "about", "approximately" or "nearly" are not used, they can be inferred.

As used herein, the term "columnar structure" refers to an elongated three-dimensional structure, and is not limited to the shape of the two ends of the three-dimensional structure. The two ends of the three-dimensional structure may have a bottom surface or a top surface respectively, or may further extend from the bottom surface or the top surface to form a complex polyhedron. The term "tetrahedral structure" used herein is a polyhedral three-dimensional structure composed of four triangular faces, and the pattern of its triangular faces is not limited. The term "width of the tetrahedral structure" used herein refers to the maximum width of the tetrahedral structure projected on the surface plane of the hydrophilic metal thin film.

EXAMPLE 1 SPUTTERING METHOD FOR HYDROPHILIC STAINLESS STEEL FILM

Firstly, a commercial 316 stainless steel (SUS316) was provided and machined into a 3-inch sputtering target. Both faces of the target were grinded and polished to ensure flatness and smoothness. DC magnetron sputtering was employed under a vacuum level (base pressure) of $1 \times 10^{-3}$ mTorr and DC electric power at 100 W. Substrate heating and bias were not applied. The $1 \times 1$ cm$^2$ silicon wafer was provided and was sputtered for 40 minutes with different argon working pressure (2, 4, 6, 8, or 12 mTorr) respectively. The resulted metal thin films with a thickness of 484 nm to 596 nm were correspondingly named as 2 mTorr film, 4 mTorr film, 6 mTorr film, 8 mTorr film, and 12 mTorr film. 316 stainless steel (SUS316) may approximately comprise at least the following elements (atom percentage): 61% of iron, 19% of chromium, 13% of nickel, 0.4% of carbon, 2% of manganese and 1.7% of molybdenum.

EXAMPLE 2 HYDROPHILIC STAINLESS STEEL FILM CHARACTERIZATION

2.1 Film Composition Analysis

The elementary composition of the 2 mTorr film, 4 mTorr film, 6 mTorr film, 8 mTorr film, 12 mTorr film, and SUS316 target in Example 1 were measured by Electron Probe Microanalyzer (EPMA), and were summarized in Table 1. The composition of the film is mainly Fe—Cr—Ni ternary alloy. Compared with the 316 stainless steel target, the atomic percentage of iron and carbon in the film increases, while the atomic percentage of manganese, nickel, and molybdenum decreases, and only chromium maintains a similar proportion.

TABLE 1 elementary composition of SUS316 target, 2 mTorr film, 4 mTorr film, 6 mTorr film, 8 mTorr film, and 12 mTorr film

| | Elementary composition (atom %) | | | | | | | | |
|---|---|---|---|---|---|---|---|---|---|
| | Fe | Cr | Ni | Mn | Mo | C | O | P | S |
| SUS316 | 61.38 | 19.18 | 13.21 | 2.02 | 1.73 | 0.37 | — | 0.08 | 0.05 |
| 2 mTorr film | 68.94 | 18.17 | 9.18 | 1.66 | 0.76 | 1.01 | 0.22 | 0.02 | 0.05 |
| 4 mTorr film | 68.65 | 18.29 | 9.15 | 1.75 | 0.82 | 1.02 | 0.25 | 0.02 | 0.05 |
| 6 mTorr film | 67.15 | 16.50 | 9.26 | 1.55 | 0.82 | 1.62 | 1.36 | 0.04 | 0.09 |
| 8 mTorr film | 67.64 | 18.0 | 9.11 | 1.63 | 0.85 | 1.93 | 0.77 | 0.02 | 0.05 |
| 12 mTorr film | 67.60 | 17.78 | 8.72 | 1.65 | 0.91 | 1.94 | 1.30 | 0.04 | 0.06 |

2.2 Crystal Structure Characterization of the Film

A transmission electron microscope (FEI Tecnai G2 F20, US) was used to capture the selected area electron diffraction (SAED) images of the 2 mTorr thin film, the 4 mTorr thin film, the 6 mTorr thin film, the 8 mTorr thin film and the 12 mTorr thin film.

As shown in FIG. 1, the SAED image of each film has a sharp, annular diffraction pattern. The d-spacing $d_{110}$, $d_{200}$, $d_{211}$, $d_{220}$ and the lattice parameter a of the innermost four circles in the figure were measured by the Tight Binding Approximation (TBA) method using the DifPack plug-in in Gatan Company's DigitalMicrograph® analysis software, and recorded in Table 2 below. The results show that the obtained crystal structures of 2 mTorr film, 4 mTorr film, 6 mTorr film, 8 mTorr film, and 12 mTorr film are polycrystalline and single-phase body-centered cubic (BCC) structure after implementing the depositing method of Example 1 using the 316 stainless steel target having a face-centered cubic (FCC) structure.

TABLE 2 d-spacing and lattice parameter of 2 mTorr film, 4 mTorr film, 6 mTorr film, 8 mTorr film, and 12 mTorr film

| unit: nm | $d_{110}$ | $d_{200}$ | $d_{211}$ | $d_{220}$ | a |
|---|---|---|---|---|---|
| 2 mTorr film | 0.206 | 0.146 | 0.119 | 0.103 | 2.915 ± 0.003 |
| 4 mTorr film | 0.208 | 0.146 | 0.121 | 0.104 | 2.942 ± 0.018 |
| 6 mTorr film | 0.208 | 0.147 | 0.119 | 0.104 | 2.915 ± 0.013 |
| 8 mTorr film | 0.208 | 0.147 | 0.120 | 0.104 | 2.915 ± 0.015 |
| 12 mTorr film | 0.206 | 0.146 | 0.121 | 0.103 | 2.915 ± 0.025 |

2.3 Surface Morphology Characterization of the Film

We conducted atomic force microscope (AFM) (Bruker Dimension Icon Scanning Probe Microscope, USA) on a 1 µm² area of 2 mTorr film, 4 mTorr film, 6 mTorr film, 8 mTorr film, and 12 mTorr film for surface morphology scanning, and recorded the height ($y_i$) of each pixel (i), and the calculated root-mean-square roughness (RMS roughness, Rq) are recorded in Table 3, wherein $$R_q = \sqrt{\frac{1}{n}\Sigma_{i=1}^{n} y_i^2}.$$

Figure 2:
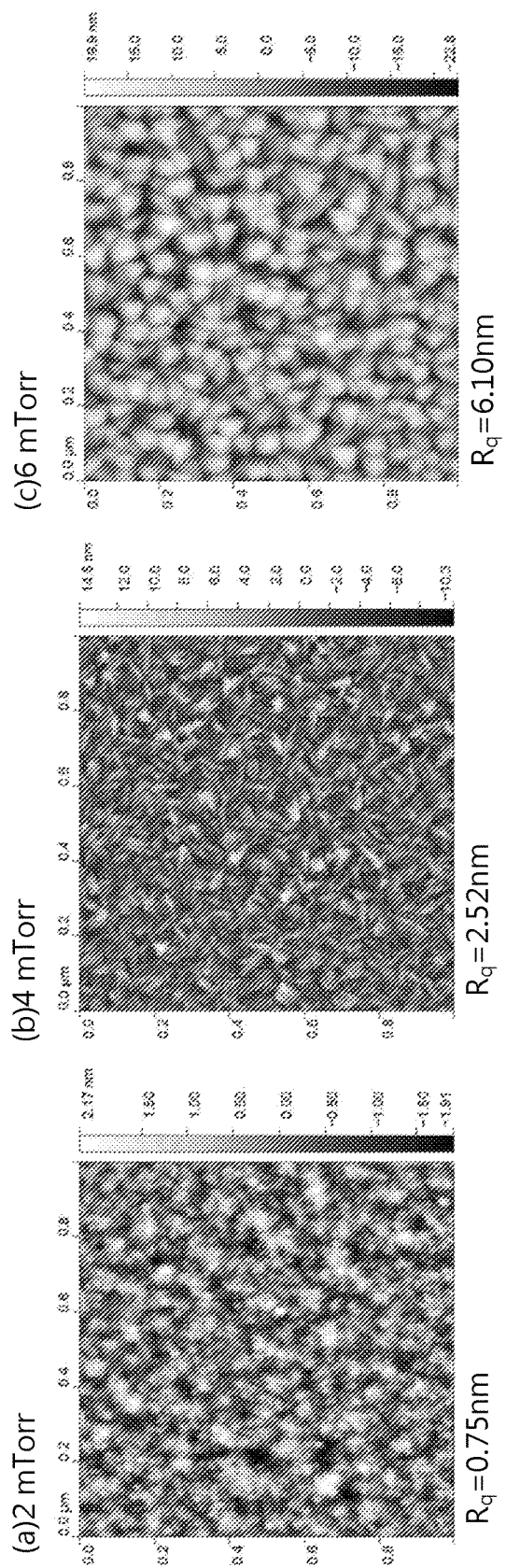
FIG. 2 (a) to (e) sequentially show the Atomic Force Microscopy (AFM) images of (a) 2 mTorr film, (b) 4 mTorr film, (c) 6 mTorr film, (d) 8 mTorr film, and (e) 12 mTorr film according to Example 1 of the present invention.
Figure 2:
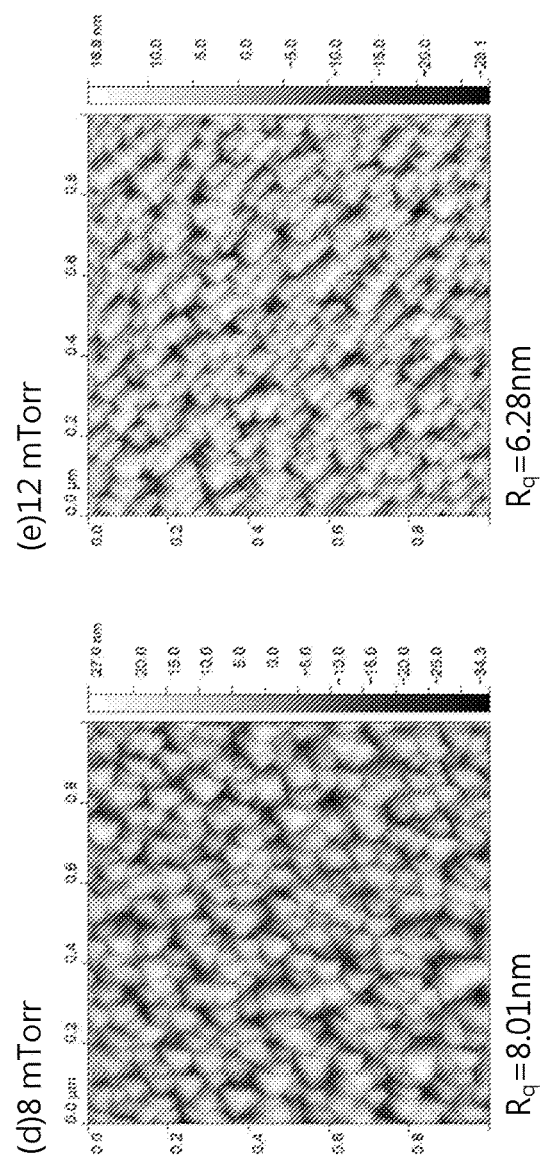

It can be seen from Table 3 that the RMS roughness is increased from 2 mTorr film to 8 mTorr film, especially dramatically increased between the 4 mTorr film and the 6 mTorr film, then decreased slightly after reaching the maximum at 8 mTorr. FIG. 2 shows that the film surface has become significantly textured with pyramid-shaped (tetrahedral structure) nano-grains from FIG. 2 (c) to FIG. 2 (e).

TABLE 3 root-mean-square roughness of 2 mTorr film, 4 mTorr film, 6 mTorr film, 8 mTorr film, and 12 mTorr film

| | 2 mTorr film | 4 mTorr film | 6 mTorr film | 8 mTorr film | 12 mTorr film |
|---|---|---|---|---|---|
| $R_q$ | 0.75 nm | 2.52 nm | 6.10 nm | 8.01 nm | 6.28 nm |

Figure 3:
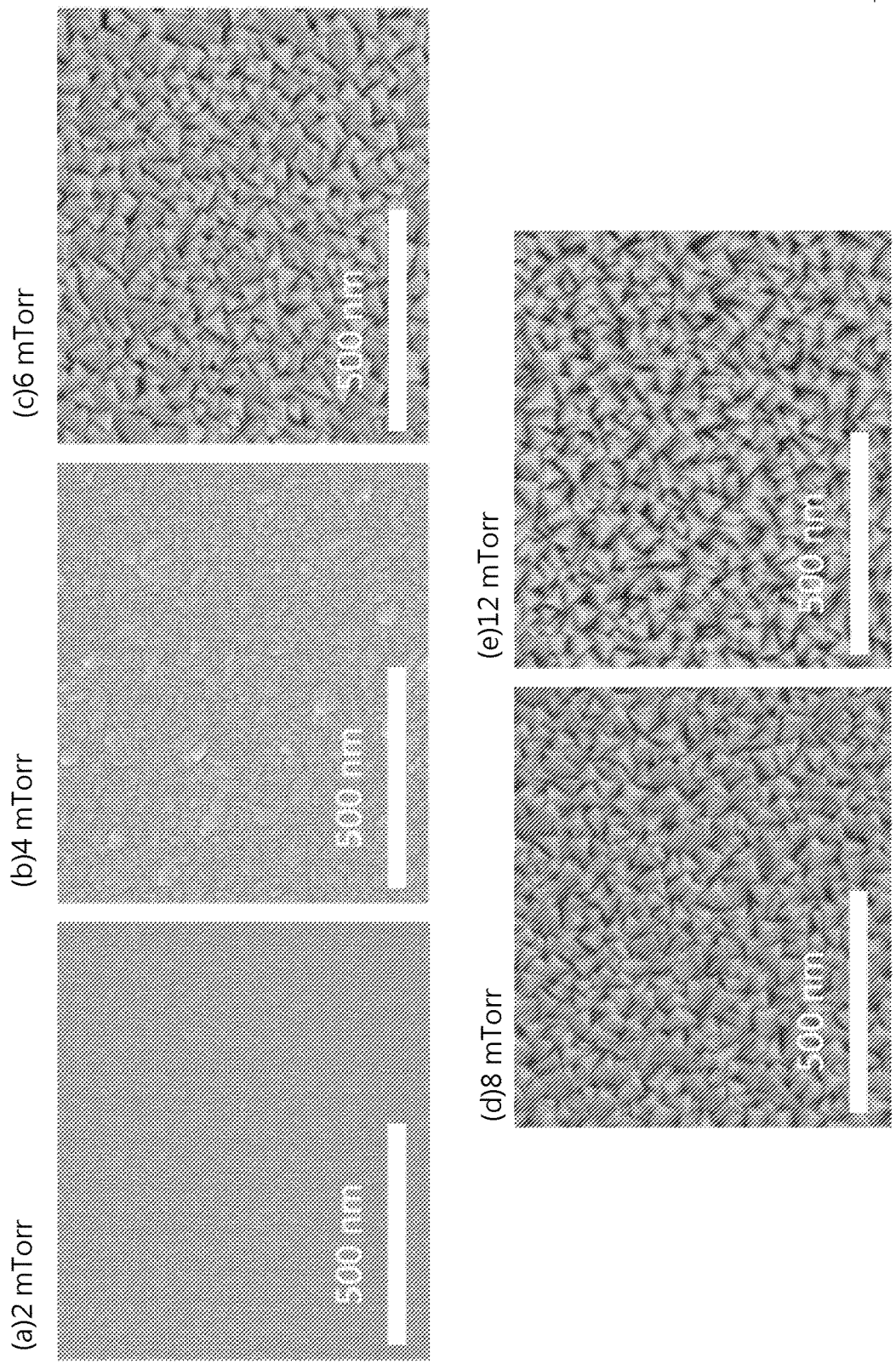
FIG. 3 (a) to (e) sequentially show the surface Scanning Electronic Microscopy (SEM) images of (a) 2 mTorr film, (b) 4 mTorr film, (c) 6 mTorr film, (d) 8 mTorr film, and (e) 12 mTorr film according to Example 1 of the present invention.

The surface morphology of the 2 mTorr film, the 4 mTorr film, the 6 mTorr film, the 8 mTorr film, and the 12 mTorr film was photographed with a scanning electron microscope (FEI Quanta 3D FEG, USA). As shown in FIG. 3, compared to the scanning results of the atomic force microscope, it can be observed in the scanning electron microscope that the surfaces of the 6 mTorr film, the 8 mTorr film, and the 12 mTorr film are also covered with nano-tetrahedral tapered structures.

Figure 4:
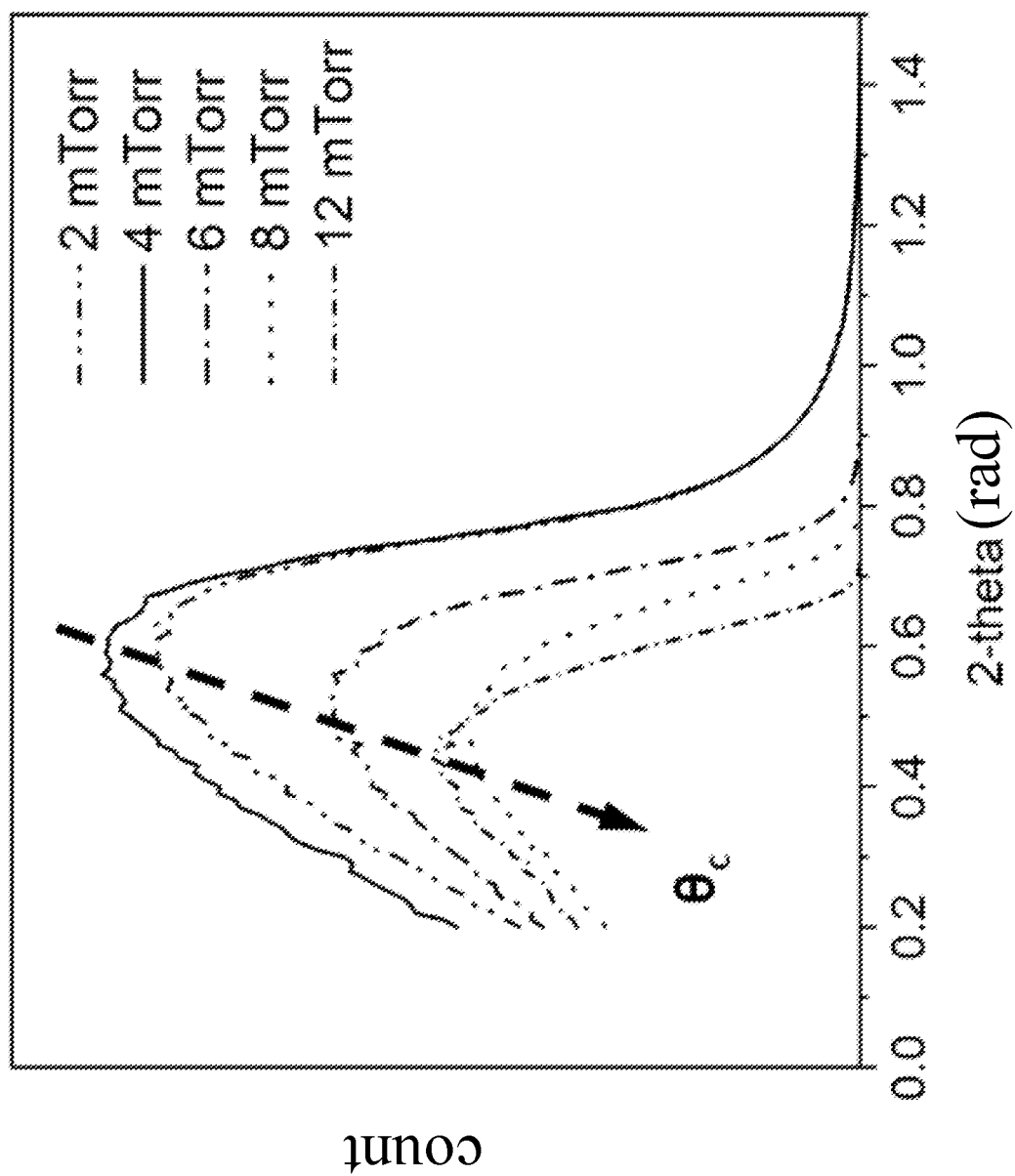
FIG. 4 shows the X-ray reflectivity spectra of 2 mTorr film, 4 mTorr film, 6 mTorr film, 8 mTorr film, and 12 mTorr film according to Example 1 of the present invention.

X-Ray Reflectivity (XRR) analysis was conducted using an X-ray diffractometer (PANalytical X'Pert Pro MRD, UK), with an increasing incident angle and with Cu Kα radiation at a voltage of 40 kV, a current of 200 mA on the 2 mTorr film, 4 mTorr film, 6 mTorr film, 8 mTorr film, and 12 mTorr film of example 1 to confirm the film density. As shown in FIG. 4, the horizontal axis represents different incident angles. The intensity of reflected X-ray attains a maximum at the critical angle of total reflection $\theta_c$, and will decay drastically when the incident angle is greater than the critical angle. Because the larger the film density is, the larger the critical angle $\theta_c$ is. When the argon working pressure increases from 2 mTorr to 12 mTorr, $2\theta_c$ is reduced from 0.6 rad to 0.45 rad, in which indicates that the film density decreases with the increase of the argon working pressure.

2.4 Film Growth Behavior

Figures 5, 6:
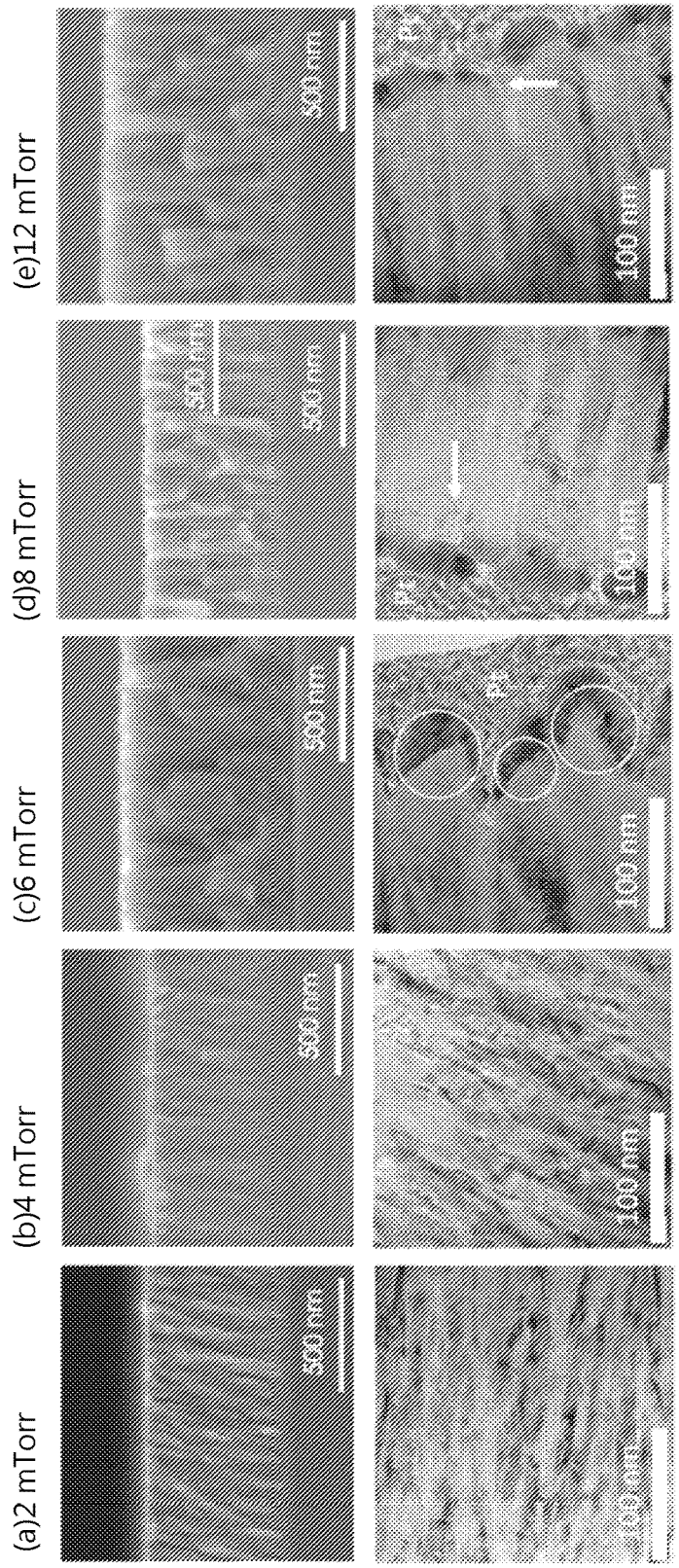
FIG. 5 (a) to (e) sequentially show the cross-sectional SEM images of (a) 2 mTorr film, (b) 4 mTorr film, (c) 6 mTorr film, (d) 8 mTorr film, and (e) 12 mTorr film according to Example 1 of the present invention.
FIG. 6 (a) to (e) sequentially show the cross-sectional Transmission Electron Microscopy (TEM) images of (a) 2 mTorr film, (b) 4 mTorr film, (c) 6 mTorr film, (d) 8 mTorr film, and (e) 12 mTorr film according to Example 1 of the present invention.

As shown in FIG. 5, the silicon substrate sputtered with 2 mTorr film, 4 mTorr film, 6 mTorr film, 8 mTorr film, and 12 mTorr film was cleaved, and the cross-section scanning electron microscope (FEI Quanta 3D FEG, US) images were captured to observe the overall film growth behavior. As shown in FIG. 6, 2 mTorr film, 4 mTorr film, 6 mTorr film, 8 mTorr film, and 12 mTorr film were milled with a focused gallium ion beam, and then the high-magnification cross-sectional images of different films were photographed with a transmission electron microscope (FEI Tecnai G2 F20, US).

FIGS. 5 and 6 show that the 2 mTorr film and the 4 mTorr film have a densely grown, fibrous grain structure, which is typical of a DC-magnetron sputtered films. As shown in FIG. 5(c) and FIG. 6(c), when the argon working pressure is increased to 6 mTorr, significant grain coarsening is observed, and nano-pyramidal shaped tips can be seen in the white circle in FIG. 6(c). These morphological changes lead to an increase in the RMS roughness of the surface, echoing the aforementioned studies on the surface morphological properties of thin films. As shown in FIGS. 5(d) to (e) and FIGS. 6(d) to (e), the sharp tips of the grains are vanished, which also explains why the 12 mTorr film has a reduced RMS roughness compared to the 8 mTorr film. In addition, open voids and gaps indicated by white arrows are occasionally observed at the boundaries of the columnar grains, which can be presumed to be the cause of the reduction in film density. Based on the above research, one can conclude the metal thin films of the example 1 of the present invention have a growth mechanism that is dependent on the argon working pressure, and have a morphological transition at a working pressure of 6 mTorr.

Figure 7:
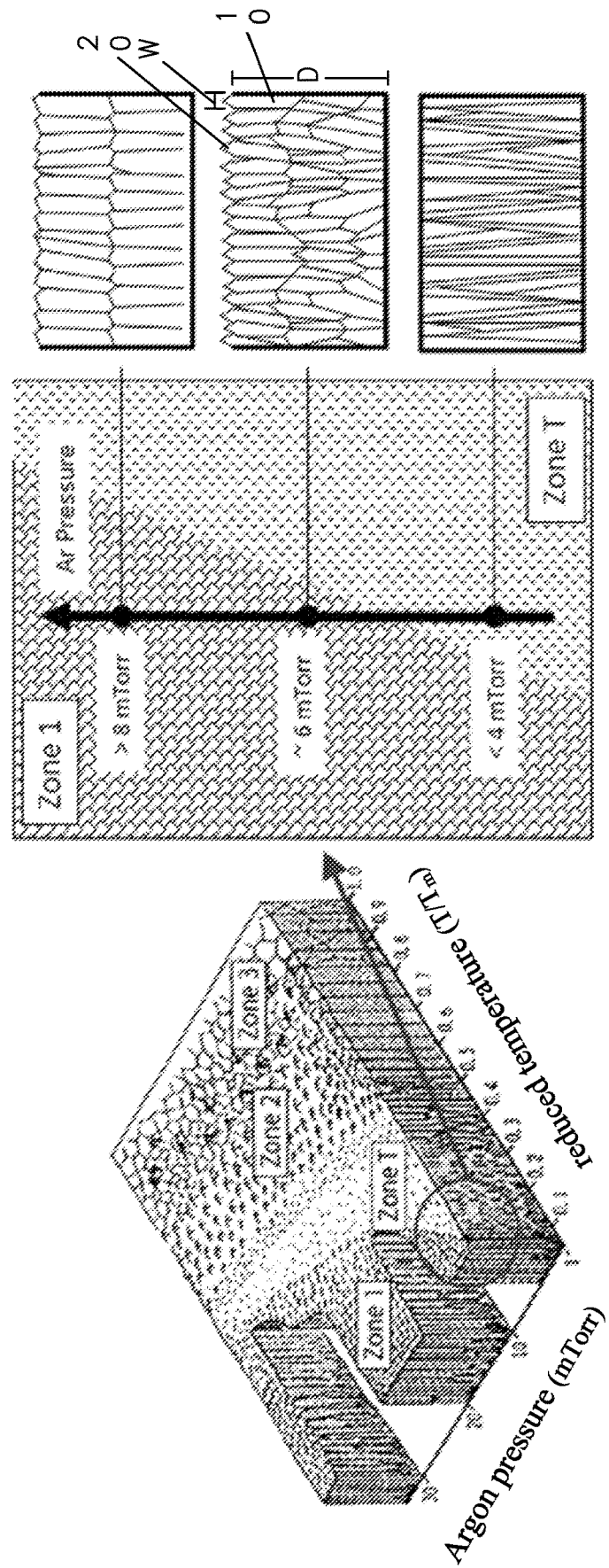
FIG. 7 is a Thornton's Structure Zone Diagram (SZD) of the stainless metal thin film according to Example 1 of the present invention and its schematic diagrams showing the zone T to zone 1 growth morphology transition and the cross-sectional structure.
Figure 8:
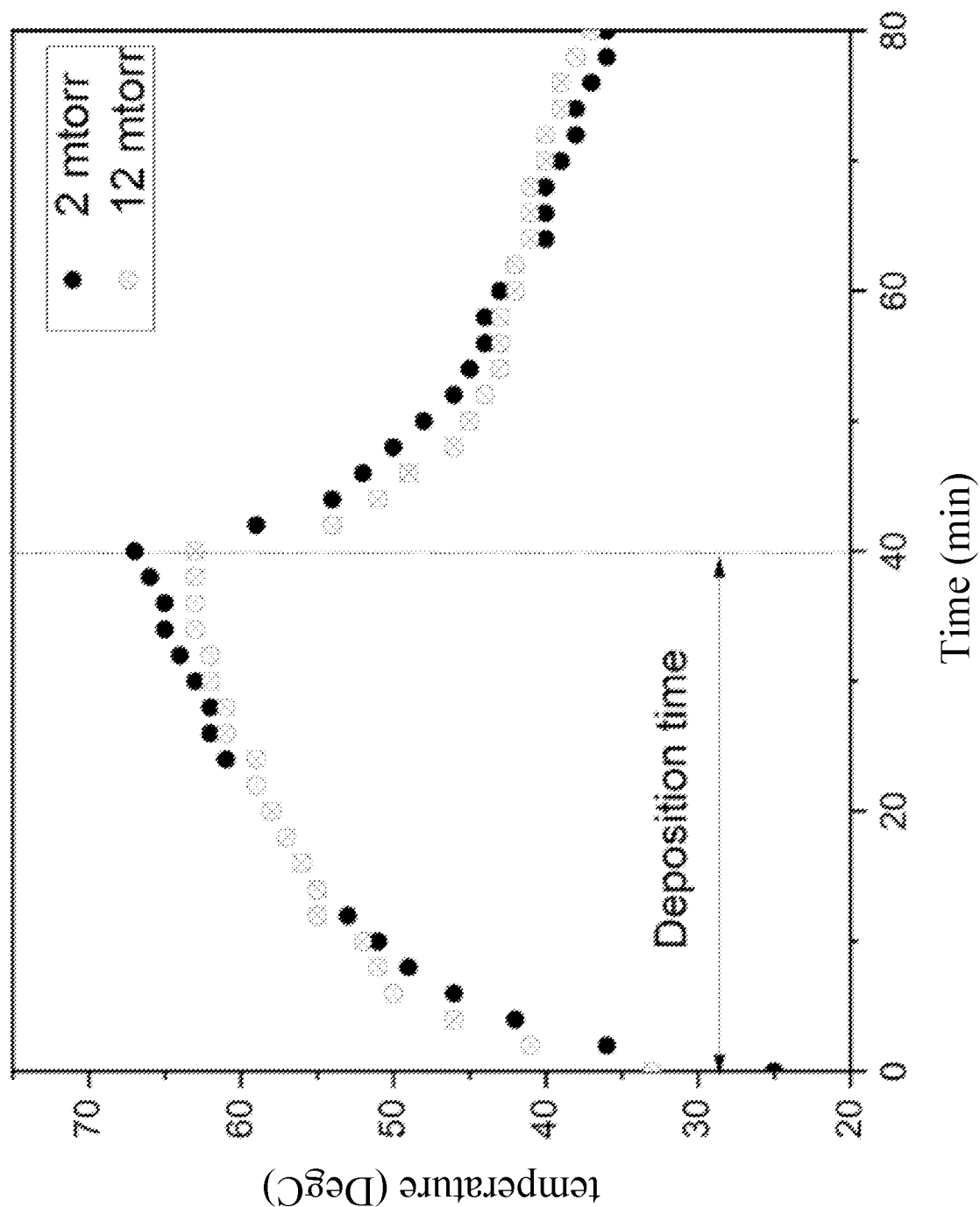
FIG. 8 shows the substrate temperature profile of 2 mTorr film and 12 mTorr film during the deposition time according to Example 1 of the present invention.

As shown in FIG. 7, the evolution of crystal structure and morphology is explained using Thornton's structural zone diagram. Referring to FIG. 8 simultaneously, the substrate temperature during and after the deposition and sputtering process under the argon working pressure of 2 mTorr and 12 mTorr was measured, and the obtained maximum temperature was 67° C. (340 K) and 63° C. (336 K) respectively. As the melting point of 316 stainless steel was about 1400° C. (1673 K), so the ratio of process temperature to material melting point for sputtering is between 0.18 and 0.21. With the increase of argon working pressure, the crystal morphology transition from Zone T to Zone 1 can be observed in FIG. 8. It can be seen that the crystal morphology begins to change from fibrous to columnar at 6 mTorr argon working pressure, and the film is formed by stacking a plurality of columnar structures 10, and plurality of tetrahedral structures 20 on the top of the columnar structures are arranged on the film surface. The thickness D of the film may range from 100 nm to 900 nm, and the width W of the tetrahedral structure 20 may range from 15 nm to 120 nm. In order to evaluate the width parameter of the tetrahedral structure, the width average of the tetrahedral structure can be calculated. For example, draw a diagonal line on the photomicrograph, count the number of tetrahedral structures and the width of each tetrahedral structure passing through the diagonal line. Then, the summation of each of the above-mentioned width of tetrahedral structures are divided by the number of tetrahedral structures to obtain a first size average of the tetrahedral structures. Repeat the above steps on another diagonal line to obtain a second size average of the tetrahedral structures. Finally, the first size average of the tetrahedral structures and the second size average of the tetrahedral structures are averaged to obtain the width parameter of the tetrahedral structure.

2.5 Wettability and Surface Analysis

Increasing nano-scaled roughness can improve the surface wettability. The wettability or other surface properties exhibited on the metal thin film with nano-scaled roughness in example 1 of the present invention are worth studying. A goniometer (Sindatek Model 100SB, Taipei, Taiwan) was used to measure the contact angles of the 2 mTorr film, 4 mTorr film, 6 mTorr film, 8 mTorr film, and 12 mTorr film just taken out of the sputtering chamber, and all results are measured 5 times and averaged. The static contact angle was measured by the sessile drop method. 2 μL of deionized water was placed on the surface of the metal thin film to be tested, and the contact angle formed during thermodynamic equilibrium was measured. The droplet of deionized water on the surface of the metal thin film to be tested was increased to 2 μL by a micro syringe at a constant speed, and the advancing contact angle was the average of contact angles measured and recorded during the increase of droplet. A 2 μL droplet of deionized water placed on the surface of the metal thin film to be tested was sucked by a micro syringe at a constant speed, and the receding contact angle was the average of contact angles measured and recorded during the decrease of droplet. The hysteresis angle is the difference between the advancing angle and the receding angle.

Figure 9:
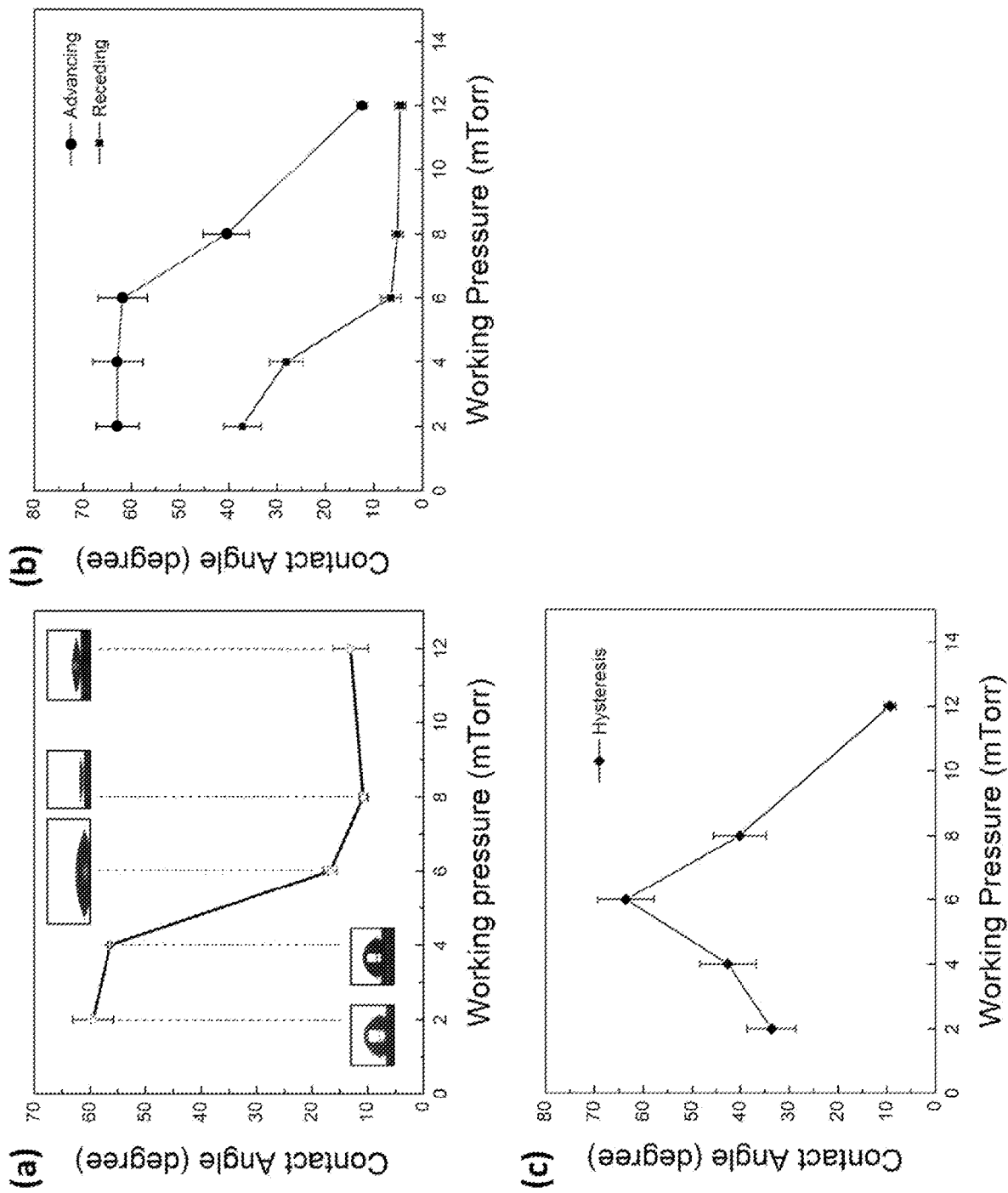
FIG. 9 (a) is a broken line graph of static contact angle of 2 mTorr film, 4 mTorr film, 6 mTorr film, 8 mTorr film, and 12 mTorr film according to Example 1 of the present invention.

As shown in FIG. 9(a), the static contact angle of the 2 mTorr film and the 4 mTorr film are between 65° and 57°, showing hydrophobicity, but the static contact angle of the 6 mTorr film is greatly reduced to 17°, implying that the film surface becomes very hydrophilic. The static contact angles of the 8 mTorr film and the 12 mTorr film are reduced to 11° and 15°, respectively, indicating that the super-hydrophilic properties originate from the roughness. As shown in FIG. 9(b), both the advancing contact angle and the receding contact angle increase with the argon working pressure. As shown in FIG. 9(c), the metal thin film of the Example 1 of the present invention has adjustable hysteresis characteristics at above 6 mTorr argon working pressure, and has a very low 9 degree hysteresis contact angle at 12 mTorr, showing that the adjustment of the argon working pressure can control the surface roughness and thus controlling the wettability of the film.

EXAMPLE 3 CRYSTAL SIZE CONTROL OF HYDROPHILIC STAINLESS STEEL FILM

As shown in FIG. 10(a) to FIG. 10(d), the magnetron sputtering method in example 1 are implemented on the silicon wafer using SUS316 target under a vacuum level (base pressure) of $1\times10^{-3}$ mTorr and argon working pressure at 12 mTorr to obtain the stainless metal thin film having tetrahedral structure with a size ranging from 15 nm to 120 nm. The power mode and electric power are: (a) DC electric power 100 W for 20 minutes of sputtering time, then RF electric power 100 W for 20 minutes of sputtering time, (b) RF electric power 100 W for 40 minutes of sputtering time, (c) DC electric power 100 W for 90 minutes of sputtering time, (d) RF electric power 100 W for 90 minutes of sputtering time, respectively. FIGS. 10 (a) to (d) respectively show that the width of the tetrahedral structure is about 15 nm, the width of the tetrahedral structure is about 35 nm, the width of the tetrahedral structure is about 53 nm, and the width of the tetrahedral structure is about 110 nm. The size of the main tetrahedral structure can be controlled by the above method to achieve the desired hydrophilic film properties. The composition atomic ratio of the stainless steel film in FIG. 10 (a) to (d) can be measured by the analytical method of 2.1 in Example 2, and the contact angle of the stainless steel film can be measured by the analytical method of 2.5 in Example 2, and those are summarized in the following Table 4.

TABLE 4 composition atomic ratio and contact angle of
stainless steel films in FIG. 10(a) to (d)

Figure 10:
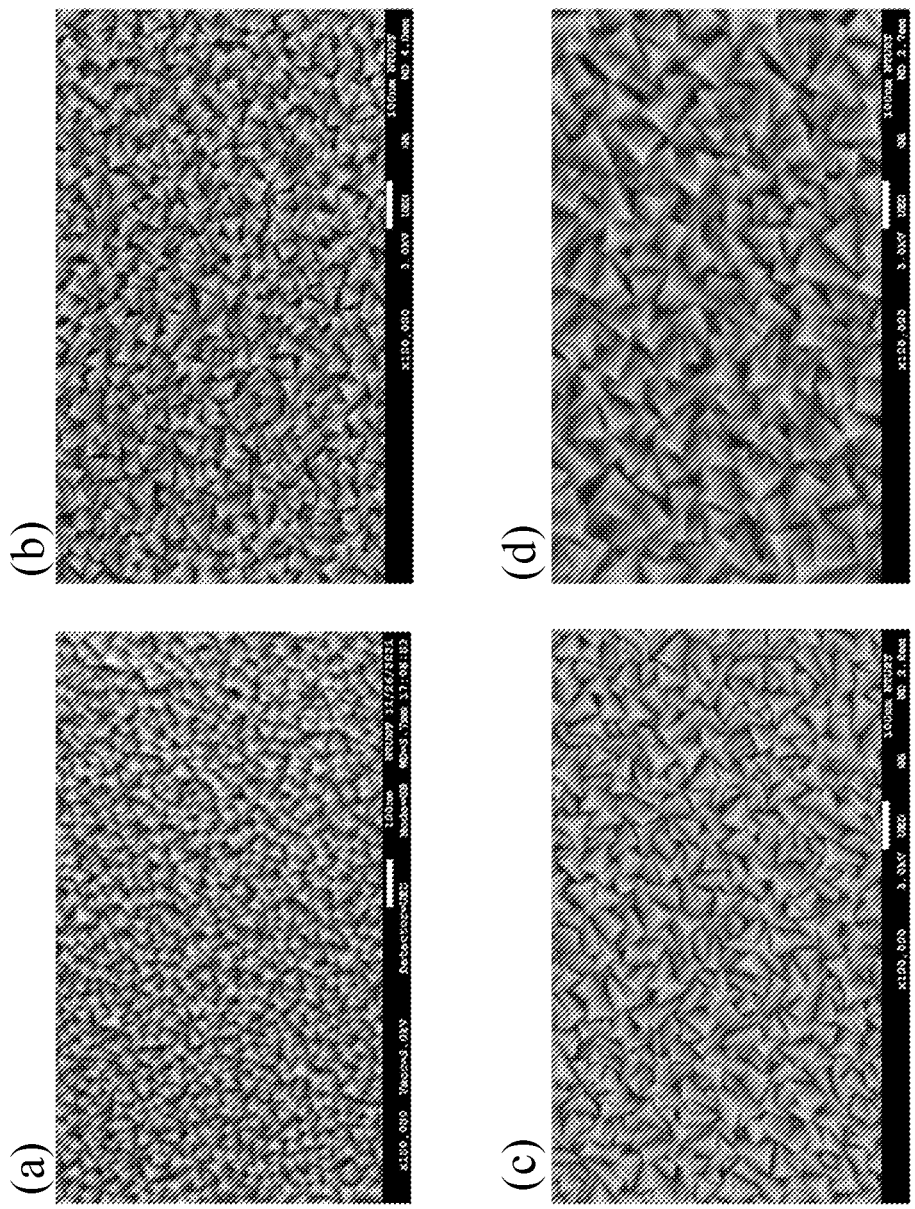
FIG. 10 (a) to (d) sequentially show the SEM images of the stainless hydrophilic thin film sputtered with the following parameters under 12 mTorr of working pressure: (a) direct current (DC) electric power 100 W for 20 minutes of sputtering time, then radio frequency (RF) electric power 100 W for 20 minutes of sputtering time, (b) RF electric power 100 W for 40 minutes of sputtering time, (c) DC electric power 100 W for 90 minutes of sputtering time, (d) RF electric power 100 W for 90 minutes of sputtering time, according to Example 3 of the present invention.

| Stainless thin film | Fe (at %) | Cr (at %) | Ni (at %) | Mn (at %) | Mo (at %) | C (at %) | Contact angle (degree) |
|---|---|---|---|---|---|---|---|
| FIG.10 (a) | 68.07 | 18.77 | 9.94 | 2.71 | 0.5 | 0.01 | 4.15 |
| FIG.10 (b) | 68.54 | 18.06 | 9.74 | 2.01 | 0.24 | 1.41 | 2.89 |
| FIG.10 (c) | 68.66 | 17.94 | 9.74 | 2.01 | 0.73 | 0.92 | 3.35 |
| FIG.10 (d) | 68.70 | 18.04 | 9.90 | 2.01 | 0.58 | 0.77 | 3.01 |

EXAMPLE 4 SPUTTERING METHOD FOR HYDROPHILIC CHROMIUM MOLYBDENUM IRON ALLOY FILM

Figure 11:
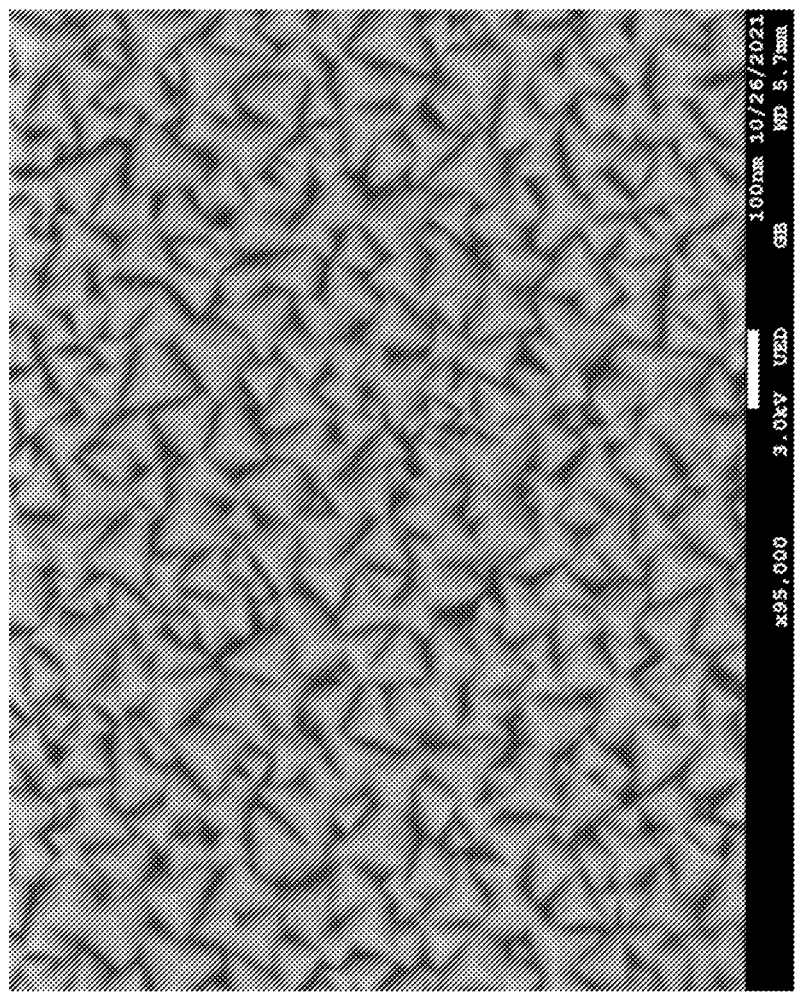
FIG. 11 shows the SEM image of the hydrophilic chromium molybdenum iron alloy thin film according to Example 4 of the present invention.

As shown in FIG. 11, the DC magnetron sputtering method in example 1 are implemented using chromium molybdenum iron alloy target under a vacuum level (base pressure) of $1\times10^{-3}$ mTorr and DC electric power at 100 W. A hydrophilic chromium molybdenum iron (Fe—Cr—Mo) alloy film with a tetrahedral structure width in the range of 37-40 nm by sputtering on a silicon wafer at an argon working pressure of 12 mTorr for 40 minutes can obtain. According to the analysis method of 2.1 in Example 2, it can be measured that the chromium molybdenum iron alloy target approximately comprises at least the following components (in atomic percentage): Fe 48%, Cr 15%, Mo 14%, C 15%, B 6%, Y 2%. Meanwhile, the hydrophilic Fe—Cr—Mo alloy film obtained by sputtering comprises at least the following components (in atomic percentage): Fe 40.34%, Cr 17.72%, Co 7.81%, Mo 13.5%, C 17.22%, Y 3.41%. The static contact angle obtained using the measurement method of 2.5 in Example 2 is 2.91 degrees.

The hydrophilic metal thin film in the embodiment of the present invention adopts stable materials such as stainless steel or chromium molybdenum iron alloy as the target material, which is suitable for sputtering on substrates of various materials, and can achieve the wettability control by adjusting the argon working pressure, power supply mode and power. It is not only suitable for use in various biomedical fields, but also makes up for the shortcomings of the originally biomedical stainless steel materials. The high hydrophilicity can also avoid the adsorption of proteins and bacteria, and promote the interaction with cells. For example, a better cell adhesive, corrosion-resistant, biochemically stable, high-strength, lightweight implant can be realized by combination with some lightweight materials in the implant.

What is claimed is:

1. A method for forming a hydrophilic metal film, comprising:
   providing a substrate;
   providing a sputtering target made of 316 stainless steel; and
   sputtering the sputtering target onto the substrate using a magnetron sputtering method under a vacuum level of $1\times10^{-3}$ mTorr, with an argon working pressure at 12 mTorr, and a sputtering time exceeding 20 minutes to obtain the hydrophilic metal film depositing on the substrate;
   wherein a surface of the hydrophilic metal film is covered with nano-tetrahedral tapered structures.

2. The method of claim 1, wherein the magnetron sputtering method is direct current (DC) magnetron sputtering with a DC electric power of 100 W.

3. The method of claim 1, wherein the magnetron sputtering method is radio frequency (RF) magnetron sputtering with an RF electric power of 100 W.

4. The method of claim 1, wherein the magnetron sputtering method is direct current (DC) magnetron sputtering with a DC electric power of 100 W, followed by radio frequency (RF) magnetron sputtering with an RF electric power of 100 W.

* * * * *